(12) United States Patent
Kobayashi

(10) Patent No.: US 10,854,769 B2
(45) Date of Patent: Dec. 1, 2020

(54) ACTIVE PHOTONIC DEVICE HAVING A DARLINGTON CONFIGURATION WITH FEEDBACK

(71) Applicant: Qorvo US, Inc., Greensboro, NC (US)

(72) Inventor: Kevin Wesley Kobayashi, Redondo Beach, CA (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/167,788

(22) Filed: Oct. 23, 2018

(65) Prior Publication Data

US 2019/0051785 A1 Feb. 14, 2019

Related U.S. Application Data

(62) Division of application No. 15/332,727, filed on Oct. 24, 2016, now Pat. No. 10,147,833.

(Continued)

(51) Int. Cl.
*H01L 31/11* (2006.01)
*H01L 31/02* (2006.01)
(Continued)

(52) U.S. Cl.
CPC ...... *H01L 31/1105* (2013.01); *H01L 27/1443* (2013.01); *H01L 31/02005* (2013.01); *H01L 31/028* (2013.01); *H01L 31/02019* (2013.01); *H01L 31/02327* (2013.01); *H01L 31/022408* (2013.01); *H01L 31/0304* (2013.01); *H01L 31/0312* (2013.01); *H01L 31/03046* (2013.01);
(Continued)

(58) Field of Classification Search
CPC ................................................ H01L 31/1105
See application file for complete search history.

(56) References Cited

U.S. PATENT DOCUMENTS 3,046,405 A  7/1962  Emeis
3,868,722 A  2/1975  Le Can et al.
(Continued)

OTHER PUBLICATIONS

Author Unknown, "043643: 10Gb/s InGaAs/InAlAs Avalanche Photodetector (APD) Die," Spectrolab, Revision A, May 24, 2012, 2 pages.

(Continued)

*Primary Examiner* — Abul Kalam
(74) *Attorney, Agent, or Firm* — Withrow & Terranova, P.L.L.C.

(57) ABSTRACT

Disclosed is an active photonic device having a Darlington configuration with a substrate and a collector layer that is over the substrate. The collector layer includes an inner collector region. An outer collector region substantially surrounds the inner collector region and is spaced apart from the inner collector region. A base layer is over the collector layer. A first outer base region and a second outer base region substantially surround the inner base region and are spaced apart from the inner base region and each other. An emitter layer is over the base layer. The emitter layer includes an inner emitter region that is ring-shaped and resides over and extends substantially around an outer periphery of the inner base region. A first outer emitter region and a second outer emitter region substantially surround the inner emitter region and are spaced apart from the inner emitter region and each other.

25 Claims, 17 Drawing Sheets

Related U.S. Application Data

(60) Provisional application No. 62/323,138, filed on Apr. 15, 2016.

(51) Int. Cl.
*H01L 31/0304* (2006.01)
*H01L 31/0312* (2006.01)
*H01L 31/028* (2006.01)
*H01L 31/18* (2006.01)
*H01L 31/0232* (2014.01)
*H01L 31/0224* (2006.01)
*H01L 27/144* (2006.01)

(52) U.S. Cl.
CPC ........ *H01L 31/184* (2013.01); *H01L 31/1808* (2013.01); *H01L 31/1812* (2013.01); *H01L 31/1844* (2013.01)

(56) References Cited

U.S. PATENT DOCUMENTS

| | | | |
|---|---|---|---|
| 4,236,119 A | 11/1980 | Battjes | |
| 4,951,106 A | 8/1990 | Blouke | |
| 4,977,314 A | 12/1990 | Niwa | |
| 5,502,338 A | 3/1996 | Suda et al. | |
| 5,541,439 A | 7/1996 | Mojaradi et al. | |
| 6,465,289 B1 | 10/2002 | Streit et al. | |
| 6,504,429 B2 | 1/2003 | Kobayashi | |
| 7,067,853 B1 | 6/2006 | Yao | |
| 8,675,272 B2* | 3/2014 | Cho | G01S 7/4816 359/238 |
| 9,151,711 B2* | 10/2015 | Cho | H01L 31/153 |
| 9,570,647 B2* | 2/2017 | Yuan | B82Y 20/00 |
| 9,933,304 B2* | 4/2018 | Kobayashi | G01J 1/44 |
| 10,056,518 B2* | 8/2018 | Kobayashi | H01L 27/1443 |
| 2003/0160266 A1 | 8/2003 | Yanagisawa | |
| 2003/0218185 A1 | 11/2003 | Ohbu et al. | |
| 2004/0065900 A1 | 4/2004 | Umemoto et al. | |
| 2008/0087918 A1 | 4/2008 | Arendt | |
| 2014/0034811 A1* | 2/2014 | Cho | H01L 27/14625 250/208.1 |
| 2015/0179862 A1* | 6/2015 | Yuan | B82Y 20/00 257/14 |
| 2015/0372181 A1 | 12/2015 | Kobayashi et al. | |
| 2017/0097261 A1 | 4/2017 | Kobayashi | |
| 2017/0301818 A1 | 10/2017 | Kobayashi | |

OTHER PUBLICATIONS

Author Unknown, "AP1503-20L5: 10 Gb/s 1550nm Avalanche Photodiode," SiFotonics, Jul. 2013, 1 page.
Author Unknown, "Ge/Si APD," SiFotonics, 2015, 1 page, http://sifotonics.com/en/index.php?m=default.product_apd&bid=7.
Author Unknown, "Welcome to Spectrolab," Spectrolab: A Boeing Company, 2009-2014, www.spectrolab.com.
Author Unknown, "World Best 25G APD," SiFotonics, 2016, 1 page, www.sifotonics.com.
Bilenca, A. et al., "Millimeter-wave generation and digital modulation in an InGaAs—InP heterojunction phototransistor: model and experimental characterization of dynamics and noise," Journal of Lightwave Technology, IEEE Aerospace and Electronic Systems Society, vol. 19, No. 9, Sep. 2001, pp. 1340-1351.
Chong, Li et al., "High bandwidth surface-illuminated InGaAs/InP uni-travelling-carrier photodetector," Chinese Physics B, vol. 22, No. 11, 2013, 5 pages.
De Barros, Jr., L.E.M et al., "Noise Performance of HBT as Photodetector in Analog Fiber-optic Communication Link," SBMO/IEEE MTT-S IMOC'97 Proceedings, Aug. 1997, IEEE, pp. 338-343.
Gonzalez, C. et al., "A 28 GHz HPT/HBT Monolithically Integrated Photoreceiver for Hybrid Fibre Radio Distribution Systems," 2000 8th IEEE International Symposium on High Performance Electron Devices for Microwave and Optoelectronic Applications, Nov. 2000, pp. 55-60.
Jo, Young-Chang et al., "Optical Properties of 1 by 16 Highly Sensitive InP/InGaAs Heterojunction Phototransistor Arrays," Proceedings of IEEE Sensors, 2004, pp. 1305-1307.
Kosaka, Hideo, "Smart Integration and Packaging of 2-D VCSEL's for High-Speed Parallel Links," IEEE Journal of Selected Topics in Quantum Electronics, vol. 5, No. 2, Mar./Apr. 1999, pp. 184-192.
Moriizumi, Toyosaka et al., "Theoretical Analysis of Heterojunction Phototransistors," IEEE Transactions on Electron Devices, vol. 19, No. 2, Feb. 1972, pp. 152-159.
Pei, Z. et al., "Integratable SiGe Phototransistor with High Speed (BW=3 GHz) and Extremely-High Avalanche Responsivity," 2003 International Semiconductor Device Research Symposium, Dec. 2003, pp. 18-19.
Prakash, D. P. et al., "Integration of Polyimide Waveguides with Traveling-Wave Phototransistors," IEEE Photonics Technology Letters, IEEE, vol. 9, No. 6, Jun. 1997, pp. 800-802.
Scott, D. C. et al., "60 GHz Sources Using Optically Driven HBTs," IEEE MTT-S International Microwave Symposium Digest, IEEE, vol. 2, Jun. 1-5, 1992, pp. 811-814.
Scott, D. C. et al., "High-Power High-Frequency Traveling-Wave Heterojunction Phototransistors with Integrated Polyimide Waveguide," IEEE Microwave and Guided Wave Letters, IEEE, vol. 8, No. 8, Aug. 1998, pp. 284-286.
Wang, H. et al., "GaAs/GaAlAs Heterojunction Bipolar Phototransistor for Monolithic Photoreceiver Operating At 140 Mbit/s," 1986 IEEE MTT-S International Microwave Symposium Digest, 1986, pp. 717-719.
Non-Final Office Action for U.S. Appl. No. 14/746,958, dated Apr. 11, 2017, 14 pages.
Notice of Allowance for U.S. Appl. No. 14/746,958, dated Apr. 13, 2018, 8 pages.
Non-Final Office Action for U.S. Appl. No. 15/332,727, dated Apr. 16, 2018, 9 pages.
Notice of Allowance for U.S. Appl. No. 15/332,727, dated Jul. 23, 2018, 8 pages.
Notice of Allowance for U.S. Appl. No. 15/219,879, dated Dec. 1, 2017, 9 pages.

\* cited by examiner

ACTIVE PHOTONIC DEVICE HAVING A DARLINGTON CONFIGURATION WITH FEEDBACK

RELATED APPLICATIONS

This application is a divisional of U.S. patent application Ser. No. 15/332,727, filed Oct. 24, 2016, now U.S. Pat. No. 10,147,833, which claims the benefit of provisional patent application No. 62/323,138, filed Apr. 15, 2016.

The present application is related to U.S. patent application Ser. No. 14/746,958, filed Jun. 23, 2015, now U.S. Pat. No. 10,056,518, entitled "ACTIVE PHOTONIC DEVICE HAVING A DARLINGTON CONFIGURATION," which claims priority to provisional patent applications No. 62/015,621 filed Jun. 23, 2014, and No. 62/029,649 filed Jul. 28, 2014.

The present application is related to U.S. patent application Ser. No. 15/219,879 filed Jul. 26, 2016, now U.S. Pat. No. 9,933,304, entitled "ACTIVE PHOTONIC DEVICE HAVING A DARLINGTON CONFIGURATION WITH FEEDBACK," which claims priority to provisional patent application No. 62/236,572 filed Oct. 2, 2015.

All of the applications listed above are hereby incorporated herein by reference in their entireties.

FIELD OF THE DISCLOSURE

The present disclosure relates to active photonic devices. In particular, the present disclosure relates to geometric configurations for active photonic devices that are usable as light detectors in optical communication receivers.

BACKGROUND

Fiber optic communication provides a major portion of the backbone of the Internet. As such, photonic devices such as lasers are used for lightwave signal transmission and photodiodes (PDs) are used for lightwave signal reception. These traditional photonic devices have parasitic inductances and parasitic capacitances that limit high frequency operation for high data rate applications such as 10-100 Gbps serial communications that are transmitted and received using lightwave signals. Moreover, a particularly sensitive photodiode, known as an avalanche photodiode (APD), is used in long haul (LH) fiber optic communication and requires a relatively high supply voltage of on the order of 50V and greater for proper operation to achieve high sensitivity enabled by the intrinsic gain of the photodetector device. Thus, what is needed is an active photonic device that has substantially reduced parasitic inductances and reduced parasitic capacitances such that high data rates of 10-100 Gbps and higher are achievable using lightwave signals. Moreover, the needed active photonic device preferably operates with a relatively low supply voltage of around 3V and includes feedback.

SUMMARY

Disclosed is an active photonic device having a Darlington configuration with a substrate and a collector layer that is over the substrate. The collector layer includes an inner collector region. An outer collector region substantially surrounds the inner collector region and is spaced apart from the inner collector region such that the inner collector region and the outer collector region are electrically isolated from each other. A base layer is over the collector layer. The base layer has an inner base region, a first outer base region, and a second outer base region. The first outer base region and the second outer base region substantially surround the inner base region and are spaced apart from the inner base region and each other. An emitter layer is over the base layer. The emitter layer includes an inner emitter region that is ring-shaped and resides over and extends substantially around an outer periphery of the inner base region. The emitter layer also includes a first outer emitter region and a second outer emitter region such that both substantially surround the inner emitter region and are spaced apart from the inner emitter region and each other.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
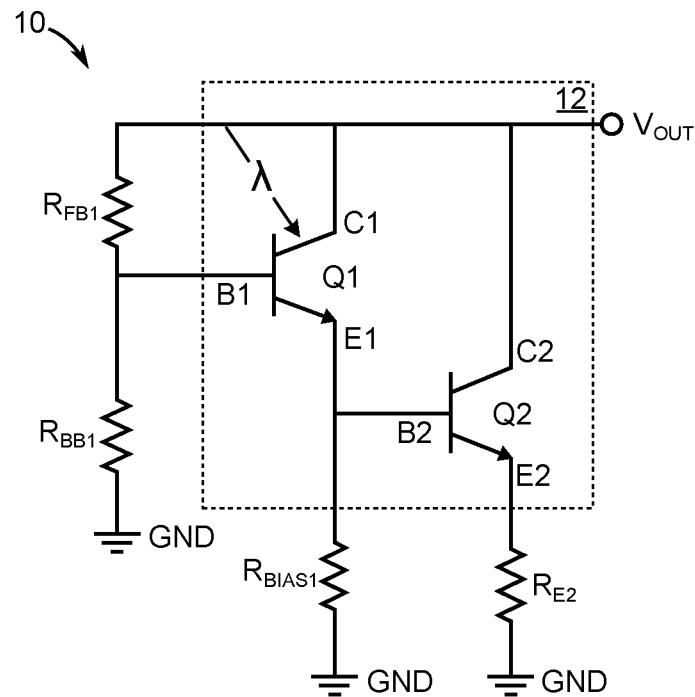
FIG. 1 is a symbolic diagram of an active photonic device of the present disclosure depicted in a common-emitter configuration with feedback.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, the phrase "substantially centered" means centered within ±10%, and the phrase "substantially constant radius" means a radial length that is maintained to within ± of an average radius. Moreover, the phrase "substantially around" means at least 50% around.

Figure 2:
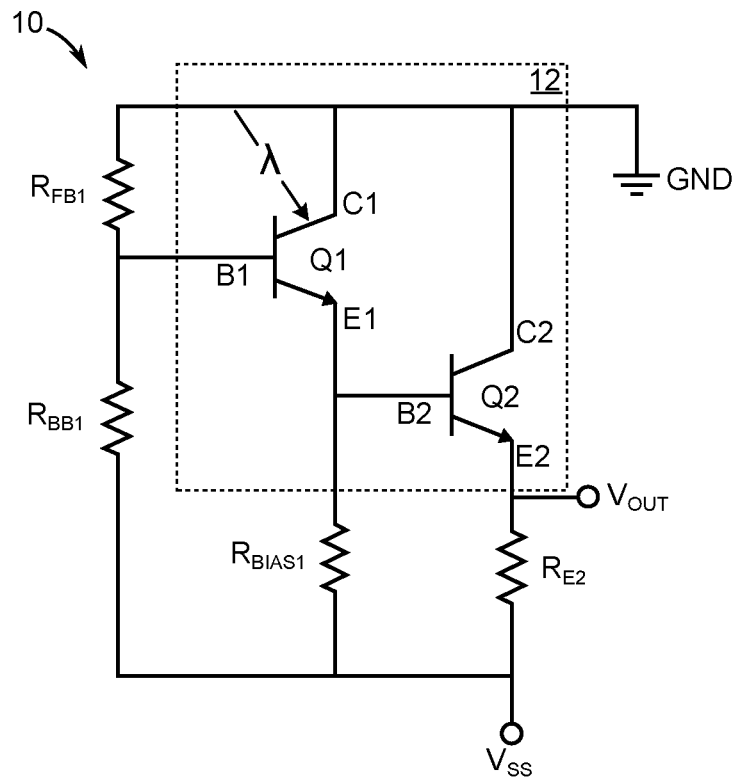
FIG. 2 is a symbolic diagram of the active photonic device of the present disclosure depicted in a common-collector configuration with feedback.
Figure 3:
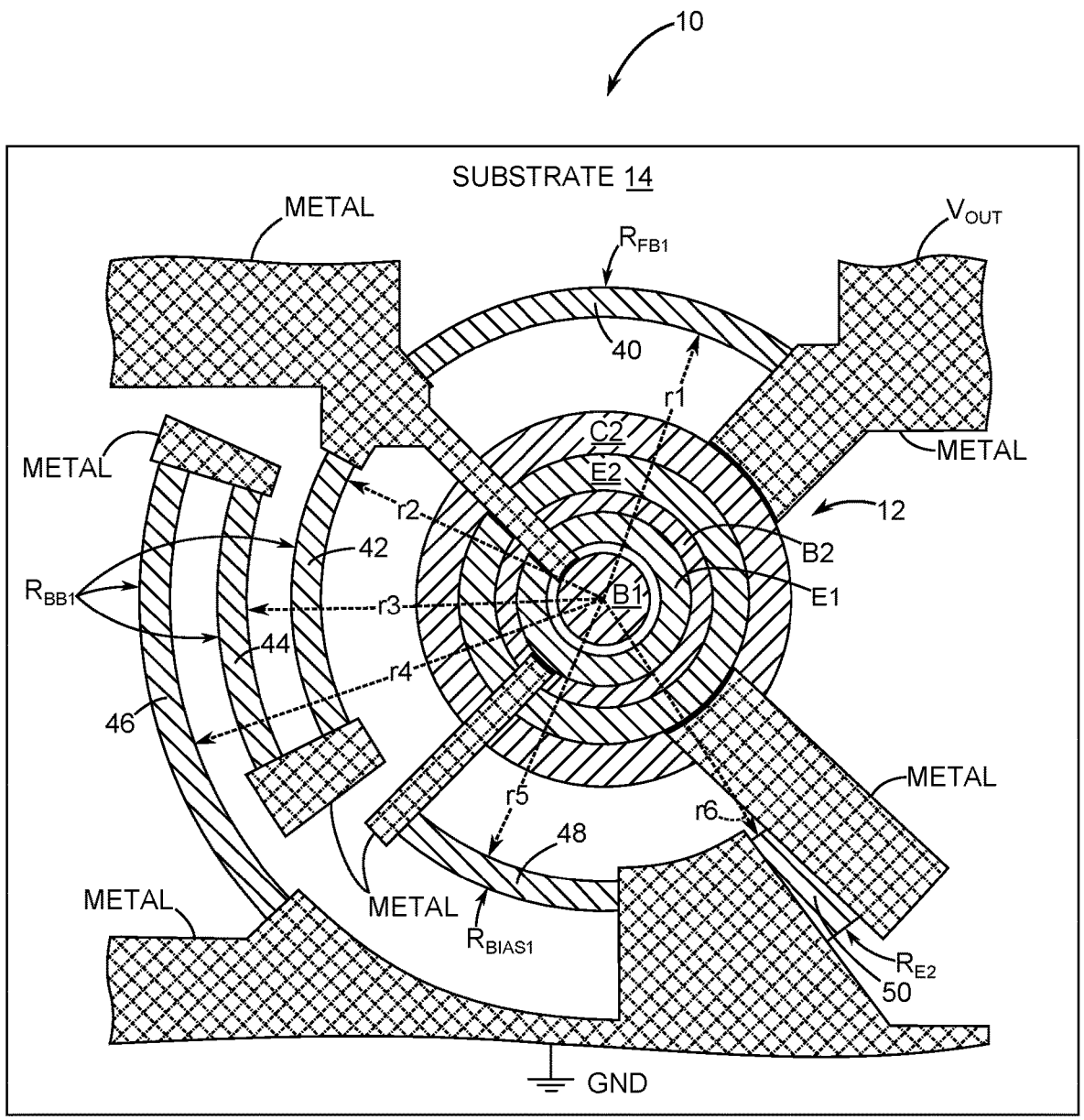
FIG. 3 is a top plan view showing a circular geometry for the common-emitter configuration of the active photonic device with feedback.

FIG. 1 is a symbolic diagram of an active photonic device 10 of the present disclosure depicted in a common-emitter configuration with feedback. FIG. 2 is a symbolic diagram of the active photonic device 10 depicted in a common-collector configuration with feedback. FIG. 3 is a top plan view showing a circular geometry for the common-emitter configuration of the active photonic device 10 with feedback. It is to be understood that the common-collector configuration has a similar circular geometry with the only exceptions being ground, voltage source, and output terminal connections. Both of the common-emitter and common-collector configurations for the active photonic device 10 each realize a heterojunction photonic Darlington-transimpedance amplifier (HPD-TIA) opto-electric integrated circuit (OEIC).

Returning to FIG. 1 and FIG. 2, the active photonic device 10 is symbolically represented as having a first transistor Q1 with an inner collector C1, an inner base B1, and an inner emitter E1. The first transistor Q1 is responsive to light λ such that an increase in light intensity causes an increase in current flow through the first transistor Q1. In other embodiments, all three transistors, Q1, Q2, Q3, may share a light absorbing intrinsic collector region that functions as a light absorbing photo detector, either from the top side, the bottom side, or from the edge or lateral side through a dielectric waveguide. The active photonic device 10 is further symbolically represented as having a second transistor Q2 with an outer collector C2, an outer base B2, and an outer emitter E2. Both of the common-emitter configuration (FIG. 1) and the common-collector configuration (FIG. 2) of the active photonic device 10 have the inner emitter E1 of the first transistor Q1 and the outer base B2 coupled together to realize a heterojunction photo-Darlington (HPD) transistor configuration 12. Moreover, in both configurations the inner collector C1 is coupled to the outer collector C2. In some embodiments, the inner collector C1 and the outer collector C2 are one and the same in that there is no physical isolation between the inner collector C1 and the outer collector C2 and share the same epitaxy sub-collector and/or collector layer(s). In the common-emitter configuration (FIG. 1), the outer collector C2 is coupled to an output terminal $V_{OUT}$. In contrast, the common-collector configuration (FIG. 2) has the outer collector C2 coupled to ground GND and the output terminal $V_{OUT}$ is coupled to the outer emitter E2.

Both of the common-emitter configuration and the common-collector configuration may have a feedback resistor $R_{FB1}$ coupled between the inner base B1 and both of the inner collector C1 and the outer collector C2. The common-emitter and common-collector configurations each include a bias resistor $R_{BIAS1}$ and an emitter resistor $R_{E2}$. However, it is to be understood that in some embodiments, the bias resistor $R_{BIAS1}$ and an emitter resistor $R_{E2}$ are optional. In the case of the common-emitter configuration, the bias resistor $R_{BIAS1}$ is coupled between the inner emitter E1 and ground GND, while the emitter resistor $R_{E2}$ is coupled between the outer emitter E2 and ground GND. In contrast, the common-collector configuration has the bias resistor $R_{BIAS1}$ coupled between the inner emitter E1 and a negative voltage source $V_{SS}$, while the emitter resistor $R_{E2}$ is coupled between the outer emitter E2 and the negative voltage source $V_{SS}$.

A base resistor $R_{BB1}$ can be included in both of the common-emitter and common-collector configurations. In the case of the common-emitter configuration, the base resistor $R_{BB1}$ is coupled between the inner base B1 and ground GND, whereas in the common-collector configuration, the base resistor $R_{BB1}$ is coupled between the inner base B1 and the negative voltage source $V_{SS}$. The base resistor $R_{BB1}$ in conjunction with feedback resistor $R_{FB1}$ sets a reverse bias voltage across the base-collector junction of the first transistor Q1 to maximize intrinsic photonic signal responsivity and bandwidth.

The bias resistor $R_{BIAS1}$ sets a quiescent bias for the first transistor Q1. An exemplary bias current ($I_{BIAS}$) for the first transistor Q1 is approximately a base-to-emitter voltage (Vbe) divided by the resistance of the bias resistor $R_{BIAS1}$ (i.e., $I_{BIAS}=Vbe/R_{BIAS1}$). Moreover, various levels of current gain between β and β2 can be achieved by adjusting a relative bias between the first transistor Q1 and the second transistor Q2. The current gain for the active photonic device 10 can be predetermined by adjusting relative sizes of emitter areas between the first transistor Q1 and the second transistor Q2 during fabrication. A current gain of approximately two times β (i.e., 2·β) with a single pole response in band can be achieved by making the emitter areas and the bias current of the first transistor Q1 and the second transistor Q2 equal. In a range close to 2·β, parallel and/or series feedback involving the feedback resistor $R_{FB1}$ and the emitter resistor $R_{E2}$, respectively, is employable to achieve a desired overall responsivity-bandwidth, a transimpedance gain-bandwidth and/or an optical-electrical gain-bandwidth response.

Figure 4:
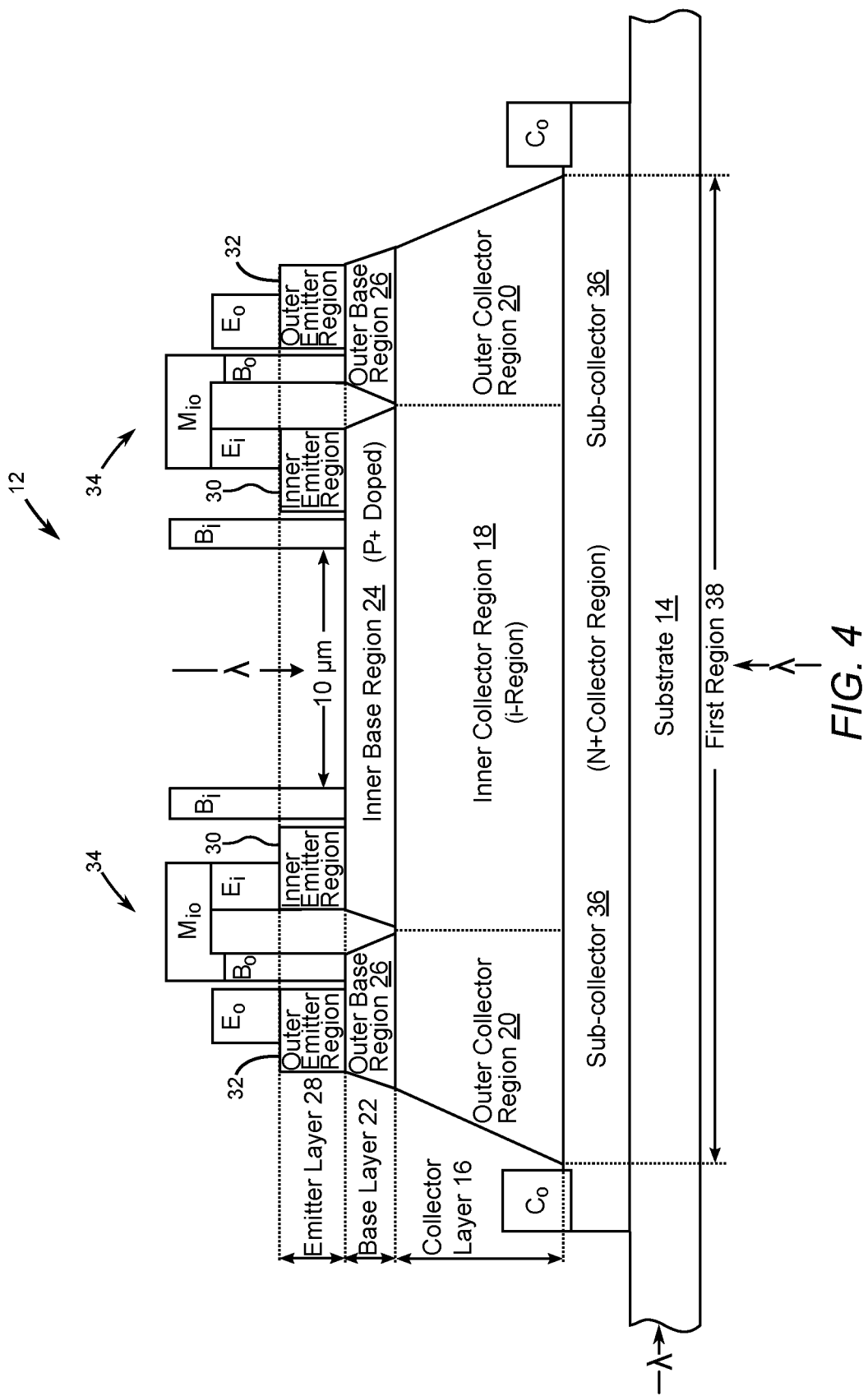
FIG. 4 is a vertical cross-section diagram of a heterojunction photo-Darlington (HPD) transistor configuration that is shown symbolically in FIG. 1 and FIG. 2.

FIG. 4 is a vertical cross-section diagram of the HPD transistor configuration 12 that is shown symbolically in FIG. 1 and FIG. 2. Referring now to both FIG. 3 and FIG. 4, the active photonic device 10 has a substrate 14 over which a collector layer 16 resides. The collector layer 16 has an inner collector region 18 and an outer collector region 20 that substantially surrounds the inner collector region 18. A base layer 22 resides over the collector layer 16. The base layer 22 includes an inner base region 24 and an outer base region 26 that substantially surrounds and is spaced apart from the inner base region 24. For reference of scale, an exemplary light opening for the inner base region 24 has a diameter that is on the order of 10 microns. However, in at least one embodiment, the substrate 14 accepts edge illuminating modulated light signals from the side and guides the data signals to the inner collector region 18. In at least another embodiment, the substrate 14 is translucent to back-side illuminating modulated light signals that pass through the substrate 14 and into the inner collector region 18.

An emitter layer 28 resides over the base layer 22. The emitter layer 28 includes an inner emitter region 30 that is ring-shaped and resides over and extends substantially around an outer periphery of the inner base region 24. The emitter layer 28 includes an outer emitter region 32 that is ring-shaped and resides over and extends substantially around the outer base region 26. A connector structure 34 electrically couples the inner emitter region 30 with the outer base region 26, wherein the collector layer 16, base layer 22, the emitter layer 28, and the connector structure 34 are substantially centered within a first region 38 over the substrate 14. The connector structure 34 includes a metal conductor $M_{io}$ that couples an inner emitter contact $E_i$ disposed on the inner emitter region 30 to an outer base contact $B_o$ disposed on the outer base region 26. An electrical signal corresponding to a light signal is typically output from an outer collector contact $C_O$, which in turn is coupled to the output terminal $V_{OUT}$. In at least some embodiments, a sub-collector 36 resides between the substrate 14 and the collector layer 16. An inner base contact $B_i$ is in contact with the inner base region 24. In the exemplary embodiment, the sub-collector region 36 is negatively doped (n+). In at least some of the embodiments, the collector layer 16, the base layer 22 and the emitter layer 28 are made of group III-V semiconductor materials.

Referring in particular to FIG. 3, the feedback resistor $R_{FB1}$ is coupled between the outer collector region 20 and the inner base region 24 and formed over the substrate 14 and is outside of the first region 38. At least a portion 40 of the feedback resistor $R_{FB1}$ is arc-shaped and resides over a first arcuate path defined by a substantially constant first radius r1 centered in the first region 38. In the exemplary embodiment depicted in FIG. 3, the entirety of the feedback resistor $R_{FB1}$ resides in the first arcuate path. It is to be understood that the arcuate nature of the resistors provides compactness to the overall structure, that other geometries for the resistors are available to those skilled in the art.

In at least the exemplary embodiment depicted in FIG. 3 the base resistor $R_{BB1}$ is coupled between the inner base region 24 and a fixed voltage node, which in this exemplary case is ground GND. The base resistor $R_{BB1}$ is formed over the substrate 14 and is outside of the first region 38. At least a first portion 42 of the base resistor $R_{BB1}$ is arc-shaped and resides over a second arcuate path defined by a substantially constant second radius r2 that is centered on the first region 38. In this exemplary embodiment the substantially constant first radius r1 and the substantially constant second radius r2 are the same. However, it is to be understood that in other embodiments, the substantially constant first radius r1 and the substantially constant second radius r2 are different.

In the exemplary embodiment of FIG. 3, at least a second portion 44 of the base resistor $R_{BB1}$ is arc-shaped and resides over a third arcuate path defined by a substantially constant third radius r3 that is centered over the first region 38. Moreover, at least a third portion 46 of the base resistor $R_{BB1}$ is arc-shaped and resides over a fourth arcuate path defined by a substantially constant fourth radius r4 centered over the first region 38.

The bias resistor $R_{BIAS1}$ is coupled between the outer base region 26 and a fixed voltage node, which in this exemplary embodiment is ground GND. The bias resistor $R_{BIAS1}$ is formed over the substrate 14 and outside of the first region 38. The bias resistor $R_{BIAS1}$ is coupled between the outer base region 26 and a fixed voltage node, which in this exemplary case is ground GND. At least a portion 48 of the bias resistor $R_{BIAS1}$ is arc-shaped and resides over a fifth arcuate path defined by a substantially constant fifth radius r5 centered over the first region 38.

The emitter resistor $R_{E2}$ is coupled between the outer emitter region 32 and a fixed voltage node, which in this exemplary embodiment is ground GND. The emitter resistor $R_{E2}$ is formed over the substrate 14 and is outside of the first region 38. At least a first portion 50 of the emitter resistor $R_{E2}$ is arc-shaped and resides over a sixth arcuate path defined by a substantially constant sixth radius r6 centered over the first region 38. The resistors $R_{FB1}$, $R_{BB1}$, $R_{BIAS1}$, and $R_{E2}$ can all be of the thin film type.

Figure 5:
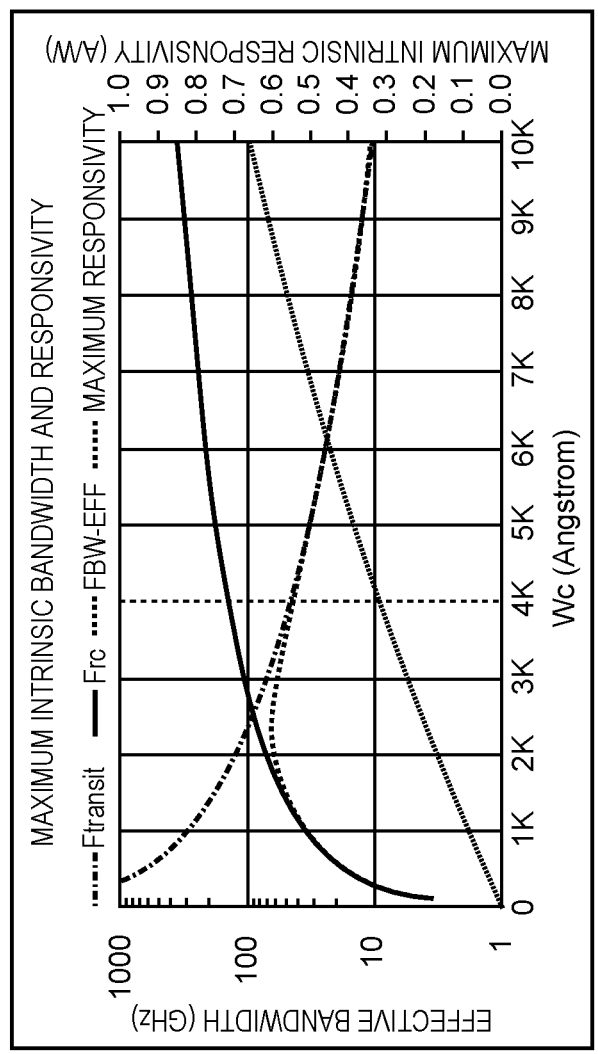
FIG. 5 is a graph based on intrinsic detector calculations for the HPD transistor configuration depicted in FIG. 4.

Returning to FIG. 4, a positive-intrinsic-negative (p-i-n) region is made up of the inner base region 24 that is P+ doped, the inner collector region 18 that is intrinsic and the sub-collector region 36 that is N+ doped. Intrinsic responsivity and bandwidth of the p-i-n region are calculated based on equations found in Chong, Li et al., "*High bandwidth surface-illuminated InGaAs/InP uni-travelling-carrier photodetector*," Chin. Phys. B, Vol. 22, No. 11 (November 2013) 118503, which is incorporated herein by reference. FIG. 5 is a nomograph based on intrinsic detector calculations for the HPD transistor configuration 12 depicted in FIG. 4. Exemplary intrinsic detector calculations assume a vertical indium gallium arsenide (InGaAs) detector, a wavelength of detection of 1.55 μm, and an intrinsic region (i-region) that is undoped. Further assumptions are that the inner collector region 18 is 4000 Angstroms thick and that a window of detection is 10 μm in diameter. Other assumptions are 100% quantum efficiency and ideal optical coupling. Under these assumptions, the calculations yield a maximum responsivity of approximately 0.324 amperes per Watt (A/W). Transit time bandwidth (Ftransit) and resistance-capacitance (RC) limited bandwidth ($F_{RC}$) calculations are 112.3 GHz and 78.8 GHz respectively.

In particular, FIG. 5 illustrates calculated intrinsic detector bandwidth and maximum responsivity versus collector thickness, Wc. As the collector thickness Wc is increased, the responsivity increases due to increased volume of the detection i-region. As a decrease in intrinsic detector capacitance and an increase in RC-limited bandwidth $F_{RC}$ occurs, the larger the collector thickness Wc becomes. However, the transit time bandwidth Ftransit decreases with larger Wc. Therefore, a point exists on the graph of FIG. 5 where the transit time and RC-limited bandwidth $F_{RC}$ calculations are equal. In this exemplary case, points of interest are located along intersections of a vertical line where the collector thickness Wc is 4000 Angstroms. The maximum responsivity found along the vertical line with a collector thickness Wc of 4000 Angstroms is 0.324 A/W and the effective bandwidth is 44.8 GHz.

The HPD transistor configuration 12 amplifies the intrinsic responsivity by a current gain H21, which is associated with an effective responsivity of the active photonic device 10. An effective bandwidth for the active photonic device 10 can be approximated by calculating the square root of a summation of the RC-limited bandwidth $F_{RC}$, the transit time bandwidth Ftransit, and a bandwidth associated with current gain H21. An overall opto-electrical integrated circuit (OEIC) response is evaluated by calculating a product of amplifier transimpedance Tz with the intrinsic responsivity of the p-i-n region given in V/W.

Figure 6:
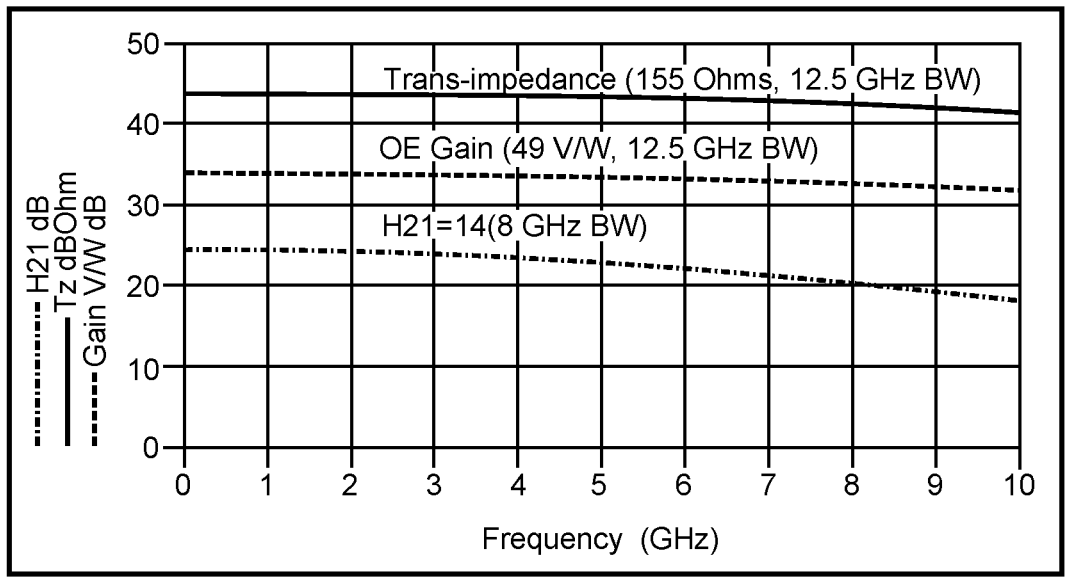
FIG. 6 is an opto-electric integrated circuit (OEIC) response graph for 10 Gbs operation of the active photonic device.

FIG. 6 is an OEIC response graph for 10 Gbps operation of the active photonic device 10. In this example, a bias point is selected to be 3V-13 mA for the active photonic device 10. The HPD current gain is 14 with an associated bandwidth of 8 GHz. The effective responsivity of the HPD is approximately 4.48 A/W. The effective transimpedance gain is 155 Ohms with a bandwidth of 12.5 GHz and the overall effective OE Gain is 49 V/W with an effective 12.5 GHz BW.

Figure 7:
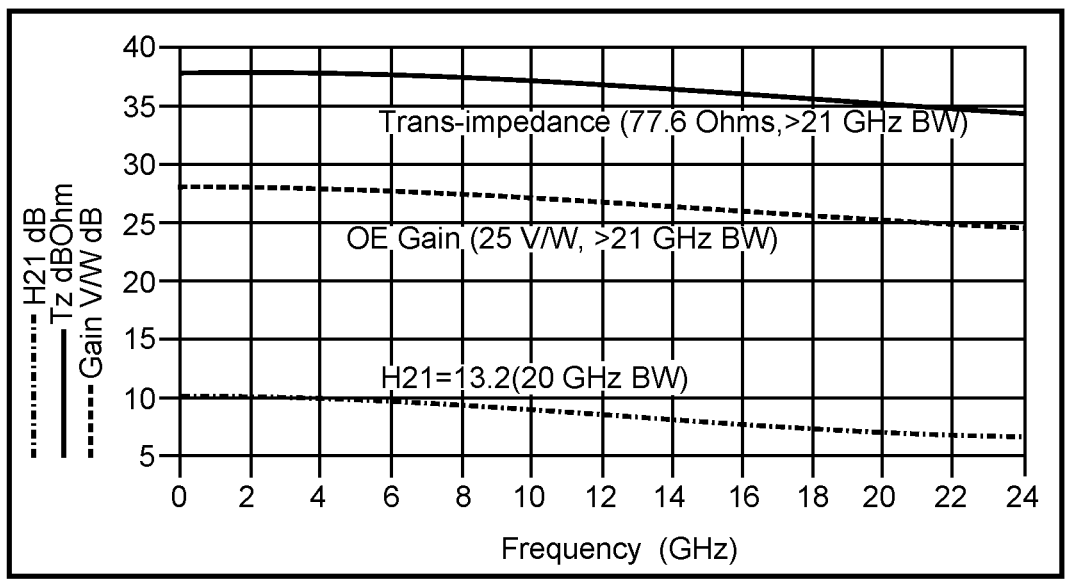
FIG. 7 is an OEIC response graph for 28 Gbs operation of the active photonic device.

FIG. 7 is an OEIC response graph for 28 Gbs operation of the active photonic device 10. The bias point is selected to be 3V-13 mA for the active photonic device 10. The HPD current gain is 3.2 with an associated bandwidth of 20 GHz. The effective HPD responsivity is approximately 1 A/W. The effective transimpedance gain is 77.6 Ohms with a bandwidth of >21 GHz. The overall effective OE Gain is 25 V/W with an effective >21 GHz bandwidth. In at least one embodiment, the active photonic device is configured to receive a modulated light signal with a bit rate of at least 100 Gbps and an electrical signal of at least 100 Gbps. Moreover, in at least some embodiments, the active photonic device 10 operates at a supply voltage that is between 1 V and 5 V.

Figure 8:
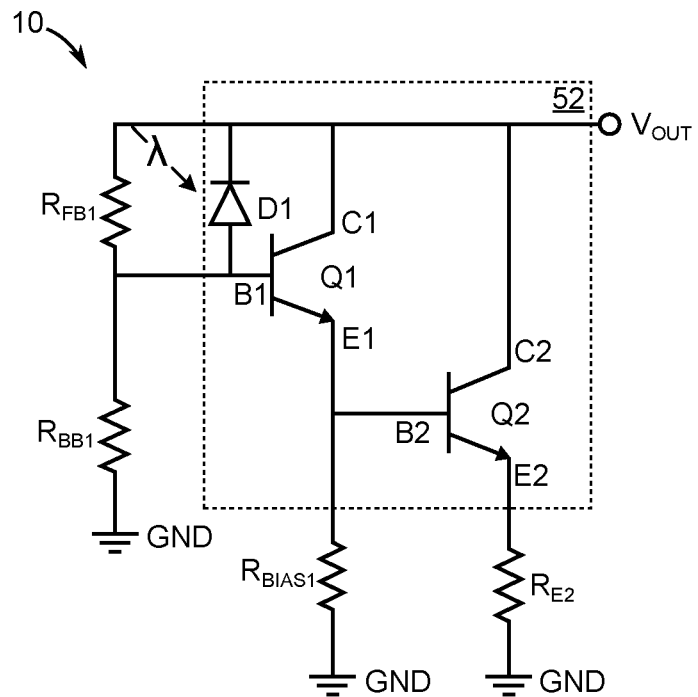
FIG. 8 is a symbolic diagram of an active photonic device of the present disclosure depicted in a p-i-n Darlington common-emitter configuration with feedback.
Figure 9:
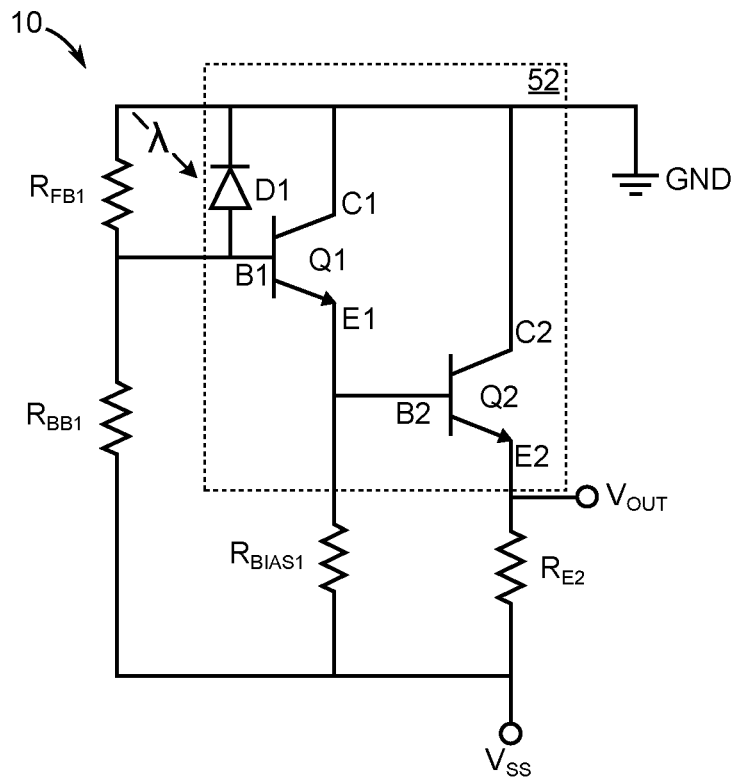
FIG. 9 is a symbolic diagram of the active photonic device of the present disclosure depicted in a p-i-n Darlington common-collector configuration with feedback.

FIG. 8 is a symbolic diagram of the active photonic device 10 depicted in a p-i-n Darlington common-emitter configuration with feedback, and FIG. 9 is a symbolic diagram of the active photonic device 10 depicted in a p-i-n Darlington common-collector configuration with feedback. In both configurations, an alternative HPD transistor configuration 52 includes a p-i-n diode D1 that has an anode coupled between the inner base B1 and the inner collector C1. Also, both schematics of FIG. 8 and FIG. 9 show that the p-i-n diode is effectively in parallel with the feedback resistor $R_{FB1}$.

Figure 10:
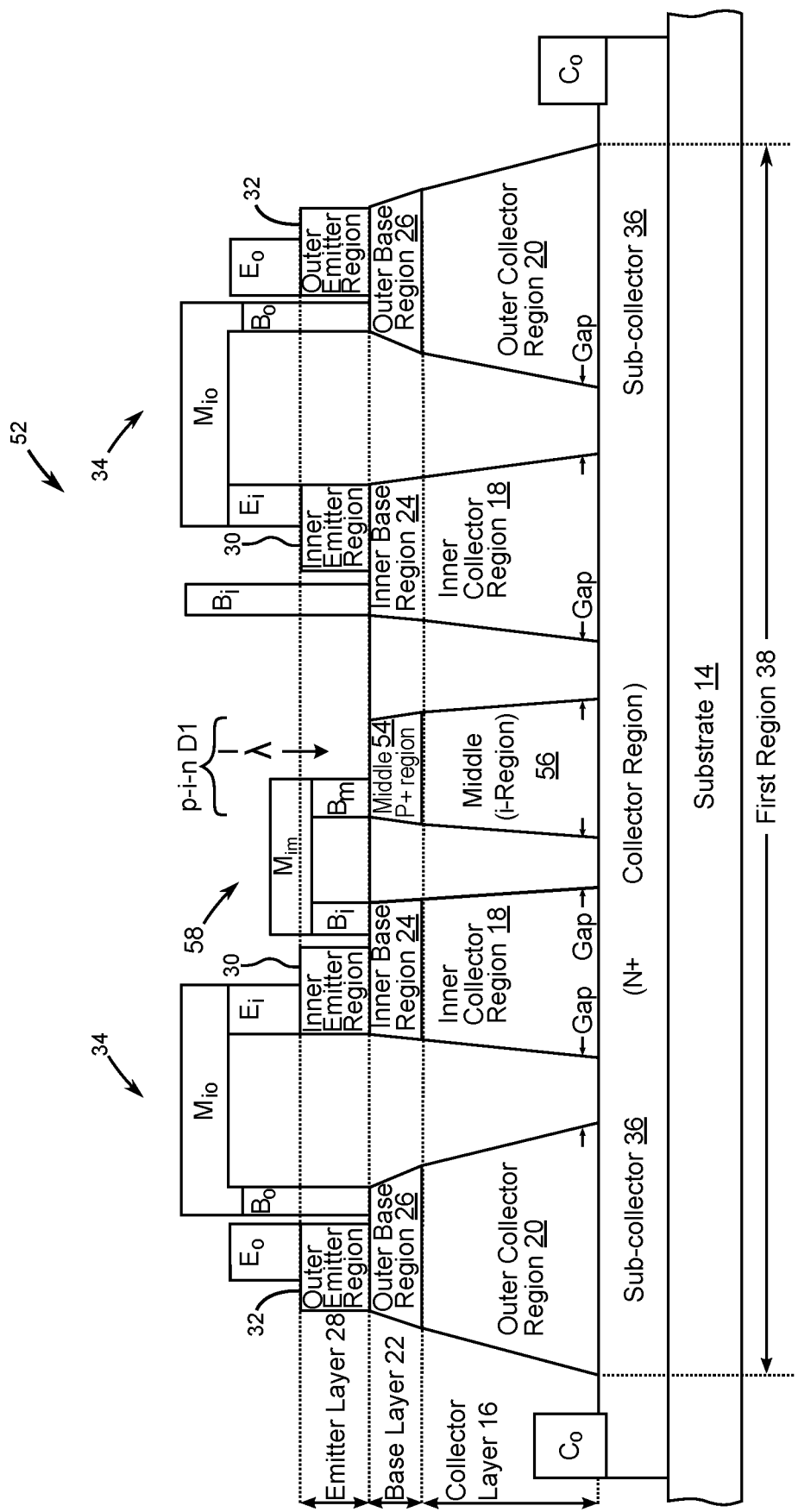
FIG. 10 is a vertical cross-section diagram of the Darlington transistor configuration that is shown symbolically in FIG. 8 and FIG. 9.

FIG. 10 is a vertical cross-section diagram of an alternate embodiment of the alternative HPD transistor configuration 52 that is shown symbolically in FIG. 8 and FIG. 9. The p-i-n Darlington transistor configuration includes the p-i-n diode D1, which is made up of a middle P+ region 54 and a middle i-region 56 that resides between the sub-collector region 36 and the middle P+ region 54. The p-i-n diode D1 is substantially centered within the first region 38. A middle connector structure 58 couples the anode of the p-i-n diode D1 to the inner base region 24. The middle connector structure 58 has a middle contact $B_m$ that is in contact with the middle P+ region 54 and a metal bridge $M_{im}$, that couples the middle contact $B_m$ to the inner base region 24 through the inner base contact B. A first gap surrounding the p-i-n diode D1 provides isolation from the inner collector region 18, and a second gap surrounding the inner collector region 18 provides isolation from the outer collector region 20.

Figure 11:
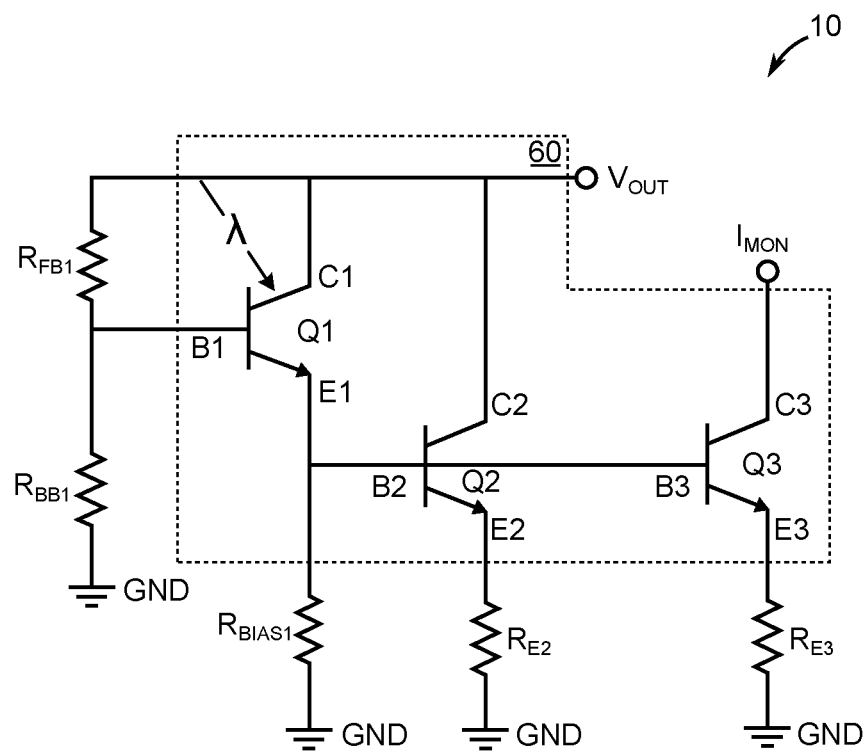
FIG. 11 is a symbolic diagram of an embodiment of the active photonic device that includes a built-in current monitor that is usable to align a fiber optic cable with light responsive regions of the active photonic device.

FIG. 11 is a symbolic diagram of an embodiment of the active photonic device 10 in which an HPD transistor configuration 60 includes a built-in current monitor in the form of a third transistor Q3. The built-in current monitor is usable to align a fiber optic cable with light responsive regions of the active photonic device 10. The third transistor Q3 comprising the built-in current monitor has a base B3 coupled to the emitter E1 of the first transistor Q1. The third transistor Q3 also has a collector C3 that is coupled to a current monitoring (IMON) terminal External devices (not shown) can be coupled to the current monitoring terminal $I_{MON}$ to provide feedback to a human technician that aligns an optical data transmitter with the active photonic detector 10. In operation, a more strongly coupled light source will generate more current flow through the $I_{MON}$ terminal. In contrast, poor alignment will lead to less current flow through the $I_{MON}$ terminal. A third emitter resistor $R_{E3}$ coupled between a fixed voltage node and an emitter E3 of the third transistor Q3, is usable to bias the third transistor Q3 for operation at a desired operating point. The fixed voltage node in this exemplary case is ground. The third resistor R3 can be constructed along a arcuate path similar to the arcuate paths defined by substantially constant radii r1-r6 depicted in FIG. 3. The third resistor R3 can be fabricated using thin film technology.

Figure 12:
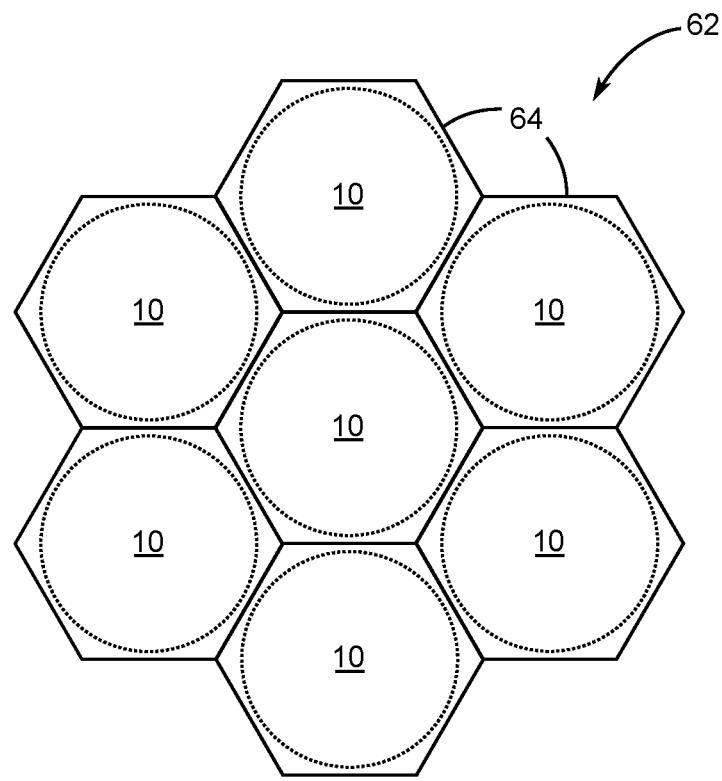
FIG. 12 is a simplified top view diagram of a photodetector array made up of a plurality of the active photonic device of the present disclosure.

FIG. 12 is a simplified top view diagram of a photodetector array 62 made up of a plurality of the active photonic device 10 having the built-in current monitor that is the third transistor Q3. An ohmic contact 64 coupled to the collector layer 16 (FIG. 10) is polygon-shaped in at least one embodiment. In an exemplary embodiment, the ohmic contact 64 is hexagonal shaped. The collector layer 16 is represented by a dashed circle because in this exemplary embodiment a light signal is received from the backside. In this embodiment, the substrate 14 (FIG. 10) is optically translucent to a desired wavelength of light to be received by the photodetector array 62. Due to the hexagonal shape, the photodetector array 62 is efficient with regard to footprint and detector area. As such, applications of this disclosure extend into high data-rate serial and/or parallel communications as well as compact voltaic solar cells wherein the disclosed ring-shaped regions have a multi-quantum structure with high spectral absorption/detection of light, which is typical of triple or multi-quantum well structures.

Figure 13:
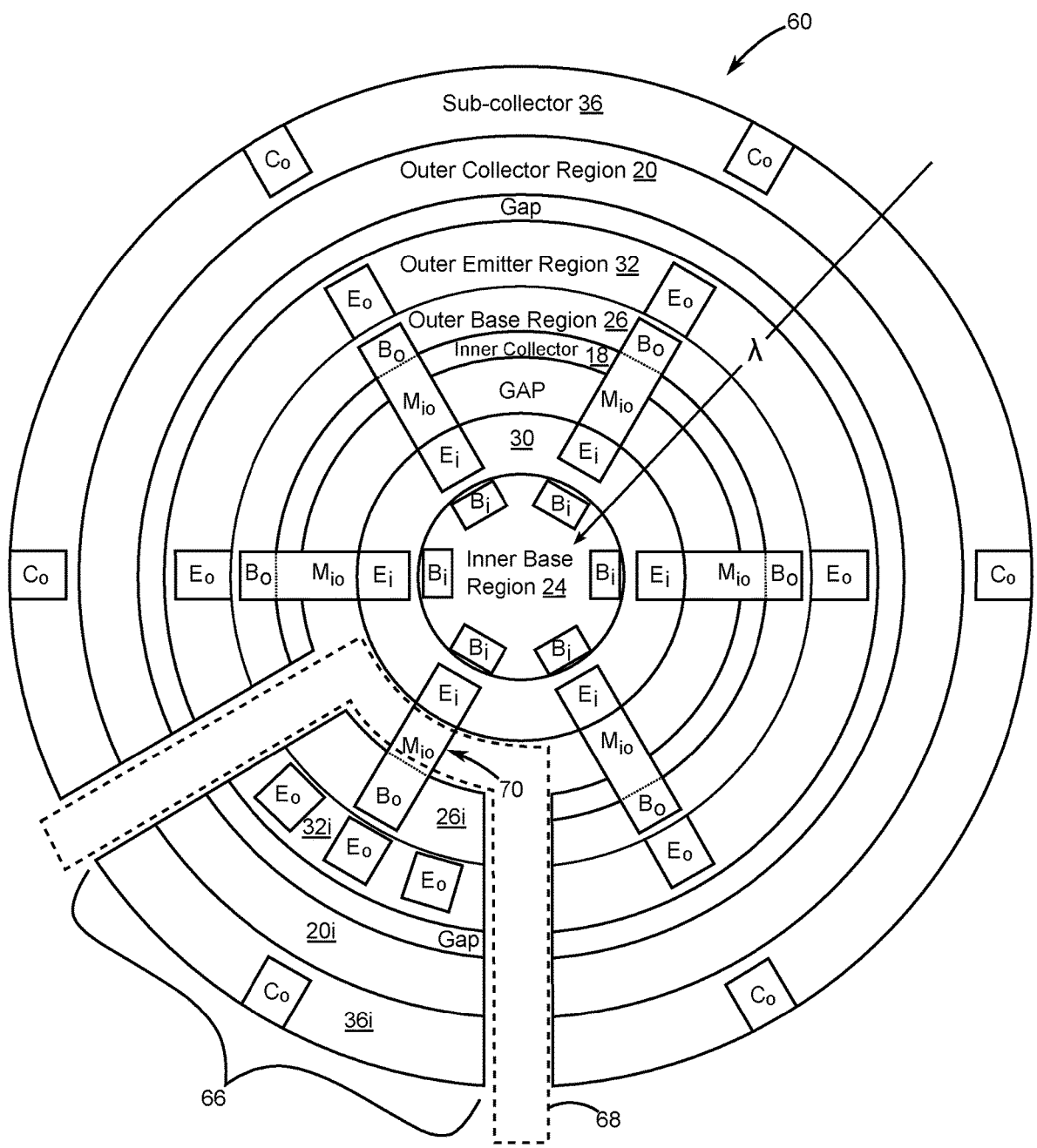
FIG. 13 is a horizontal cross-section diagram of the active photonic device of FIG. 11 that depicts an isolated section of circular transistor elements that comprise the built-in current monitor.

FIG. 13 is a horizontal cross-section diagram of the HPD transistor configuration 60 symbolically depicted in FIG. 11. An isolated section 66 of the HPD transistor configuration 60 comprises the third transistor Q3. In this exemplary embodiment, the isolation section 66 is isolated from other sections of the HPD transistor configuration 60 by an etched boundary 68. As such, the third transistor Q3 is made up of an outer collector region 20$i$, an isolated outer base region 26$i$, an isolated outer emitter 32$i$, and an isolated sub-collector 36$i$. A isolation connector structure 70 couples the inner emitter region 30 with the isolated outer base region 26$i$.

Each of the embodiments described above disclose a heterojunction photo-Darlington device that typically operates from a 3V supply while providing a multiplication gain of 14 with an 8 GHz bandwidth. However, obtaining higher gain from these embodiments is not likely without sacrificing bandwidth and low noise performance. The following embodiments integrate a heterojunction photo transistor (HPT) pre-amplifier and a transition frequency multiplier (fT-multiplier) that shares a common device epitaxy. The resulting active photonic device is a heterojunction photonic device (HPD) composite having a higher gain of at least 19.6 while providing a bandwidth capability that is greater than 10 GHz. Moreover, the active photonic device has a circular geometry that is conducive for assembling two dimensional (2D) arrays of pluralities of active photonic devices.

Figure 14:
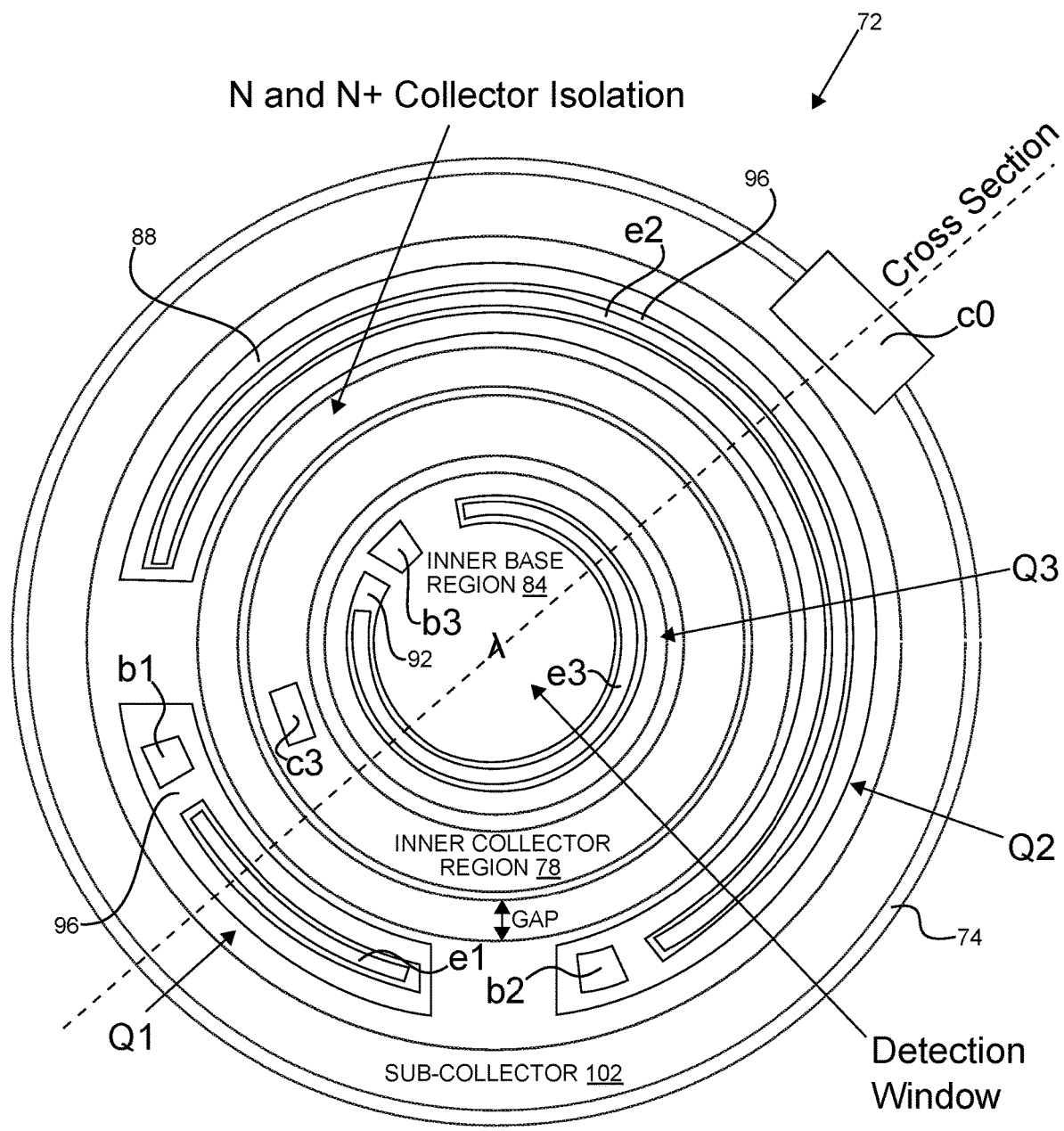
FIG. 14 is a top plan view showing a circular geometry for an active photonic device having a Darlington configuration that is in accordance with the present disclosure.
Figure 15:
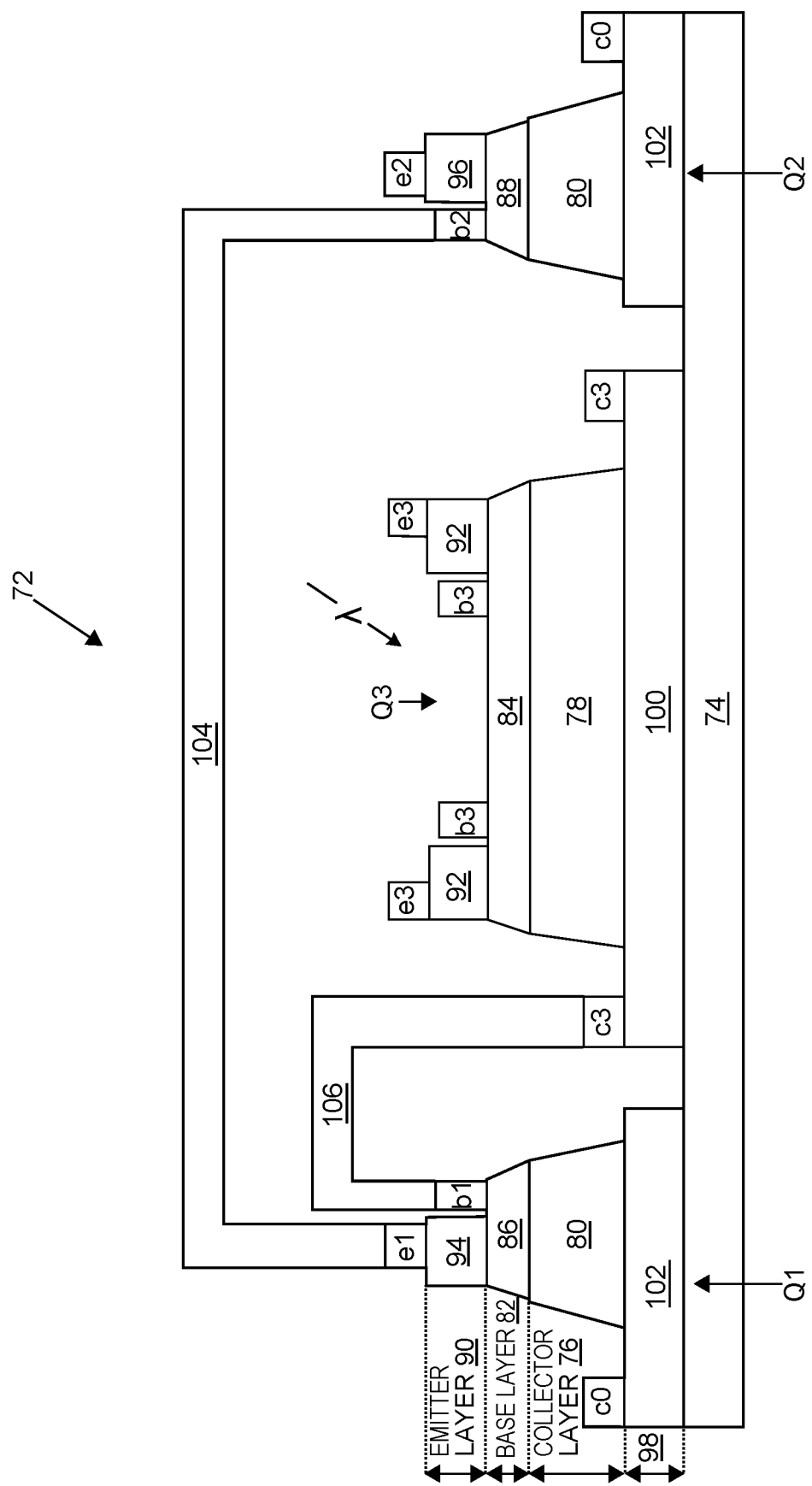
FIG. 15 is a vertical cross-section diagram of the active photonic device of FIG. 14.

FIG. 14 is a top plan view showing a circular geometry for an active photonic device 72 having a Darlington configuration that is in accordance with the present disclosure and FIG. 15 is a vertical cross-section diagram of the active photonic device of FIG. 14. The active photonic device 72 has a substrate 74 and a collector layer 76 that is over the substrate 74. The collector layer 76 includes an inner collector region 78. In at least one embodiment, the inner collector region 78 is lightly doped. For the purpose of this disclosure, the phrase lightly doped is defined as a doped semiconductor having a carrier concentration within a range of the native intrinsic doping level of the semiconductor layer which may be $0.5 \times 10^{15}$ cm$^{-3}$ to $1 \times 10^{19}$ cm$^{-3}$.

An outer collector region 80 substantially surrounds the inner collector region 78 and is spaced apart from the inner collector region 78 such that the inner collector region 78 and the outer collector region 80 are electrically isolated from each other. In this disclosure, the phrase "substantially surround" is defined as surrounding an inner region by at least 50%.

A base layer 82 is over the collector layer 76. The base layer 82 has an inner base region 84, a first outer base region 86, and a second outer base region 88. The first outer base region 86 and the second outer base region 88 substantially surround the inner base region 84 and are spaced apart from the inner base region 84 and each other. In some embodiments, the base layer 82 is made of germanium. In other embodiments, the base layer 82 is made of silicon-germanium. In yet other embodiments, both the collector layer 76 and the base layer 82 are made of silicon germanium.

An emitter layer 90 is over the base layer 82. The emitter layer 90 includes an inner emitter region 92 that is ring-shaped and resides over and extends substantially around an outer periphery of the inner base region 84. The emitter layer 90 also includes a first outer emitter region 94 and a second outer emitter region 96 that substantially surround the inner emitter region 92 and are spaced apart from the inner emitter region 92 and each other. In FIG. 14, the items labeled b1, b2, b3, c0, c1, c2, c3, e1, e2, and e3 are ohmic contacts.

As best seen in FIG. 15, the active photonic device 72 further includes a sub-collector layer 98 that resides between the collector layer 76 and the substrate 74, wherein the sub-collector layer 98 has an inner sub-collector region 100 and an outer sub-collector region 102, wherein the outer sub-collector region 102 is spaced apart from the inner sub-collector region 100 while substantially surrounding the inner sub-collector region 100. FIG. 15 also depicts a first connector structure 104 that electrically couples the first outer emitter region 94 to the second outer base region 88. A second connector structure 106 electrically couples the first outer base region 86 with the inner sub-collector region 100.

Figure 16:
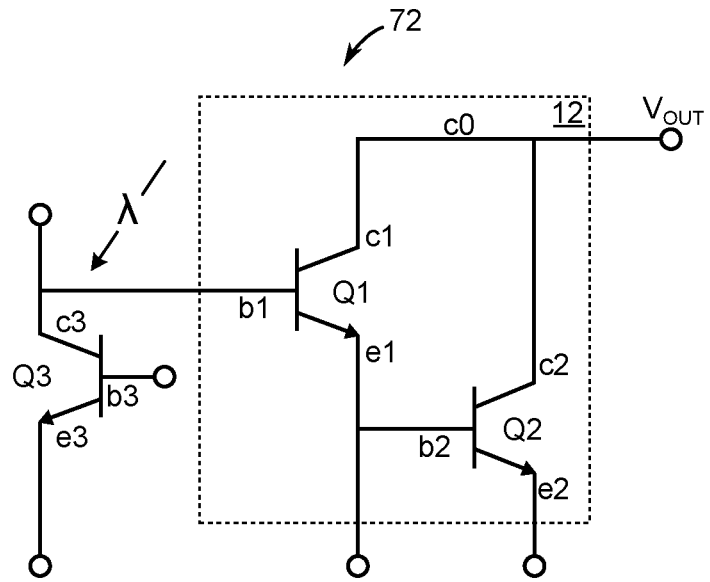
FIG. 16 is a circuit schematic that depicts an equivalent circuit topology of the active photonic device illustrated in FIG. 14 and FIG. 15.

FIG. 16 is a circuit schematic that depicts an equivalent circuit topology of the active photonic device 72 illustrated in FIG. 14 and FIG. 15. This equivalent circuit topology is considered an integrated common-emitter HPT and Darlington transmitter pair that provides a transition frequency multiplier (fT-multiplier) function. In particular, the outer collector region 80, the first outer base region 86, and the first outer emitter region 94 form a first transistor Q1, and the outer collector region 80, the second outer base region 88, and the second outer emitter region 96 form a second transistor Q2 that is coupled to the first transistor in a Darlington configuration. Moreover, the inner collector region 78, the inner base region 84, and the inner emitter region 92 form a third transistor Q3 having the inner collector region 78 coupled to the first outer base region 86 of the first transistor Q1 for driving the first transistor Q1 and the second transistor Q2 when light impinges upon the third transistor Q3.

Figure 17:
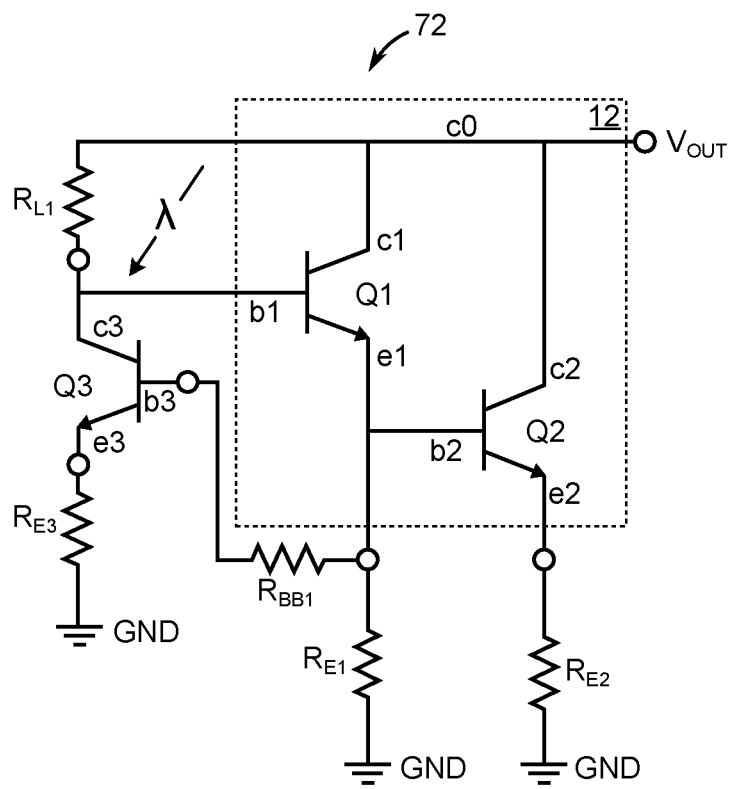
FIG. 17 is a circuit schematic that depicts another equivalent circuit topology of FIG. 16 with added resistors used to adjust a combination of bias and radio frequency (RF) feedback that sets overall amplifier feedback characteristics.

FIG. 17 is a circuit schematic that depicts another equivalent circuit topology of FIG. 16 with added resistors used to adjust a combination of bias and radio frequency (RF) feedback that set overall amplifier feedback characteristics.

A load resistor $R_{L1}$ is coupled between the outer collector contact c0 and the inner collector contact c3. A base resistor $R_{BB1}$ is coupled between the emitter contact e1 and the inner base contact b3. A first emitter resistor $R_{E1}$ is coupled between the first emitter contact e1 and a fixed voltage node such as ground GND. A second emitter resistor $R_{E2}$ is coupled between the second emitter contact e2 and a fixed voltage node such as ground GND, and a third emitter resistor $R_{E3}$ is coupled between the first emitter contact e3 and a fixed voltage node such as ground GND.

Returning to FIG. 5, calculated intrinsic detector bandwidth and maximum responsivity versus collector thickness is also applicable to the active photonic device 72 illustrated in FIGS. 14 and 15. As the collector thickness Wc is increased, the responsivity increases due to increased volume of the detection i-region. As a decrease in intrinsic detector capacitance and an increase in RC-limited bandwidth $F_{RC}$ occurs, collector thickness Wc increases. However, the transit time bandwidth Ftransit decreases with larger Wc. Therefore, a point exists on the graph of FIG. 5 at which the transit time bandwidth Ftransit and RC-limited bandwidth $F_{RC}$ calculations are equal. In this exemplary case, points of interest are located along intersections of a vertical line at which the collector thickness Wc is 4000 Angstroms. The maximum responsivity found along the vertical line with a collector thickness Wc of 4000 Angstroms is 0.324 A/W and the effective bandwidth is 44.8 GHz.

The HPD transistor configuration 12 amplifies the intrinsic responsivity by a current gain H21, which is associated with an effective responsivity of the active photonic device 10. An effective bandwidth for the active photonic device 10 can be approximated by calculating the square root of a summation of the RC-limited bandwidth $F_{RC}$, the transit time bandwidth Ftransit, and a bandwidth associated with current gain H21. An overall opto-electrical integrated circuit (OEIC) response is evaluated by calculating a product of amplifier transimpedance Tz with the intrinsic responsivity of the p-i-n region given in V/W.

Figure 18:
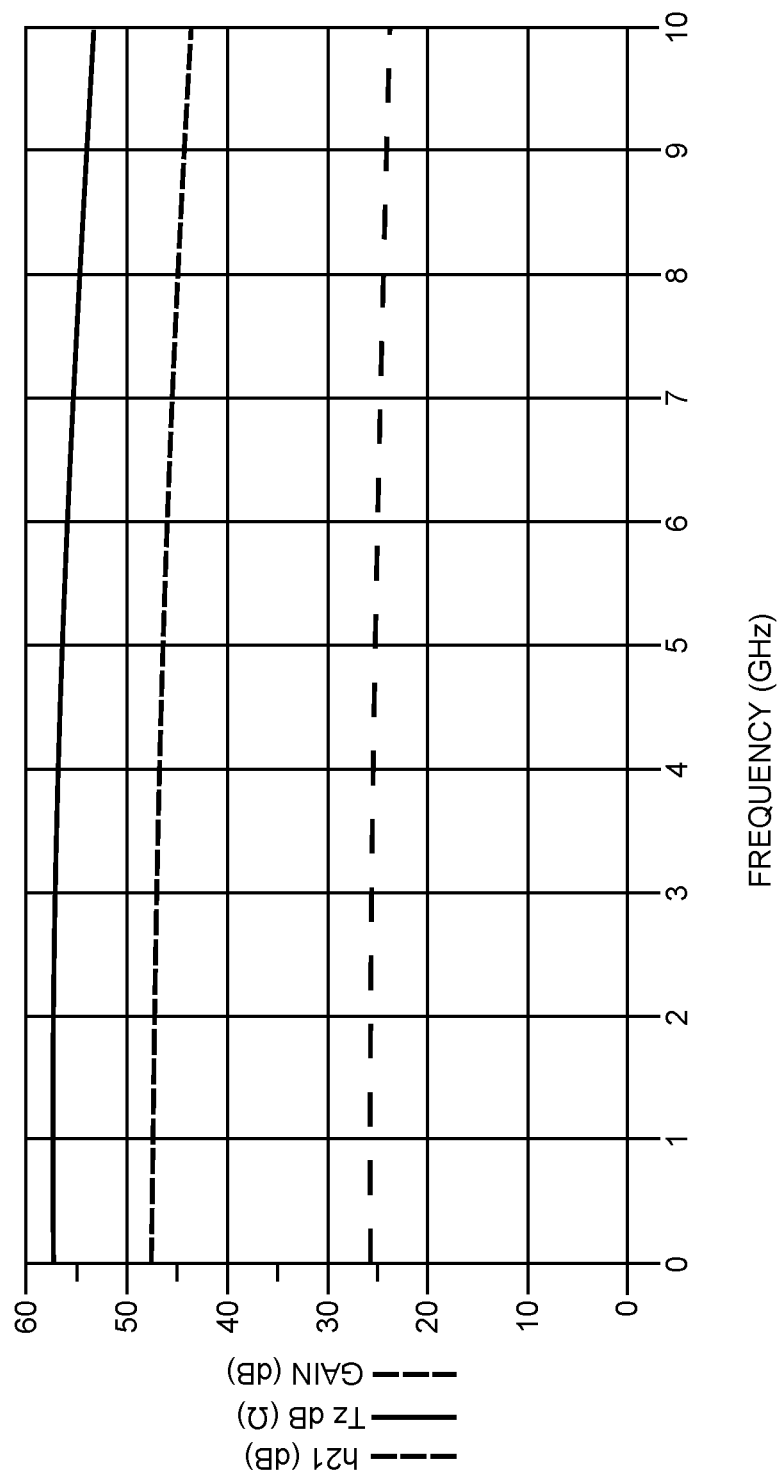
FIG. 18 is a graph of current gain H21, optoelectric (OE) gain, and trans-impedance gain frequency response of a 10 GHZ bandwidth embodiment of the active photonic device illustrated in FIG. 14 and FIG. 15.

FIG. 18 is a graph of current gain H21, optoelectric (OE) gain, and trans-impedance gain frequency response of a 10 GHZ bandwidth embodiment of the active photonic device 72 illustrated in FIG. 14 and FIG. 15. As depicted in the graph of H21 versus frequency, an H21 of 19.6 with greater than 10 GHz bandwidth was obtained. This level of H21 is a factor of 2 greater than a comparable 10 GHz avalanche photodiode (APD) with a lesser bandwidth of 8 GHz. In addition, an exemplary embodiment of the active photonic device 72 provides a current-to-voltage conversion gain in the form of a trans-impedance of about 870 Ohms at 10 GHz. In contrast, an APD does not provide a comparable current-to-voltage conversion or the inherent impedance buffering associated with the active photonic device 72. Further still, at least one embodiment of the active photonic device 72 achieves an OE gain response of at least 278 V/W at a 10 GHz bandwidth.

Figure 19:
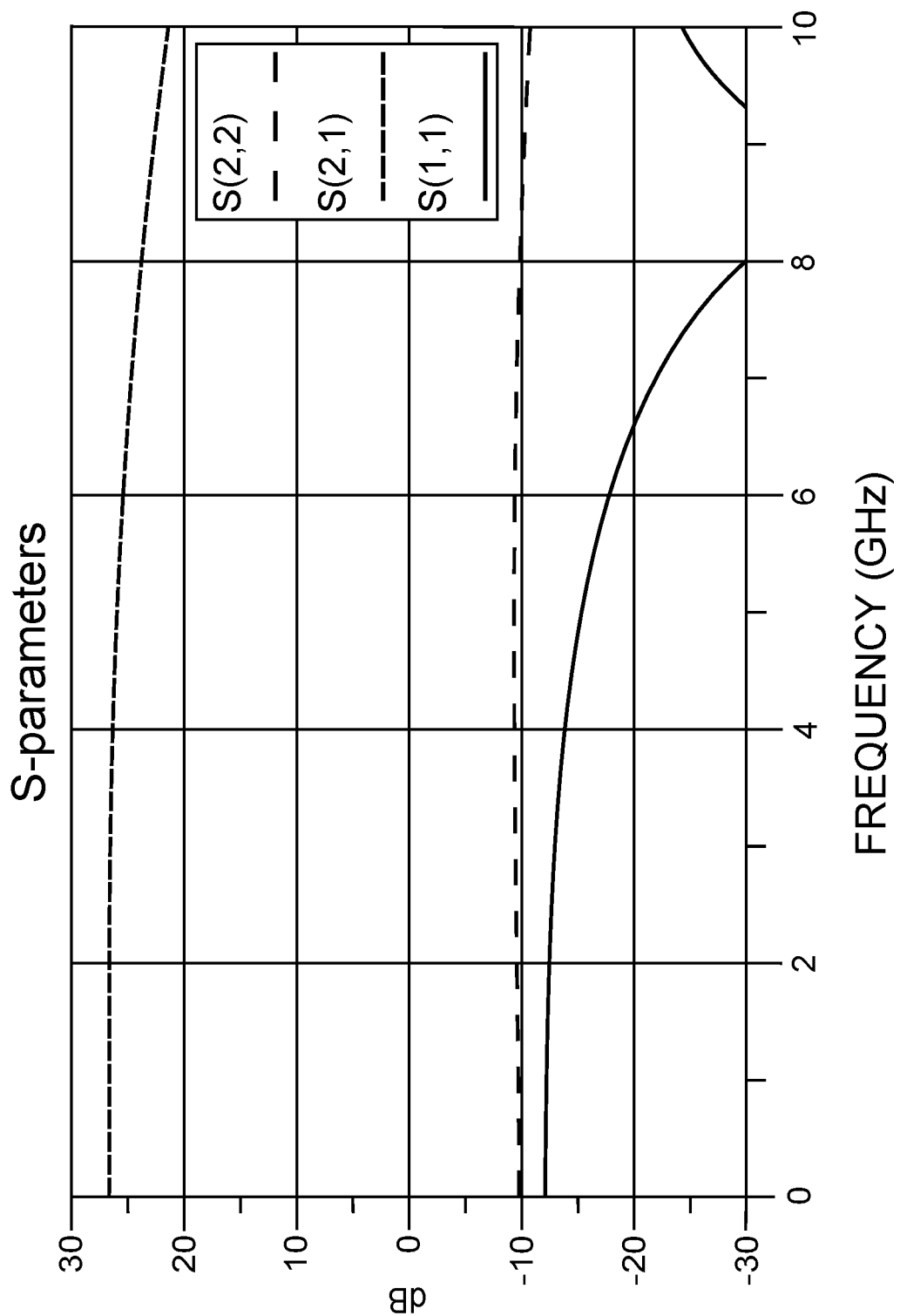
FIG. 19 is a graph of scattering parameters (S-parameters) for the active photonic device illustrated in FIG. 14 and FIG. 15 for a practical output match of 10 dB return loss.

FIG. 19 is a graph of scattering parameters (S-parameters) for the active photonic device 72 illustrated in FIG. 14 and FIG. 15 for a practical output match of 10 dB return loss. In comparison, an APD does not include load buffering, thus APD has a greater susceptibility to parasitic circuit elements associated with a load.

Figure 20:
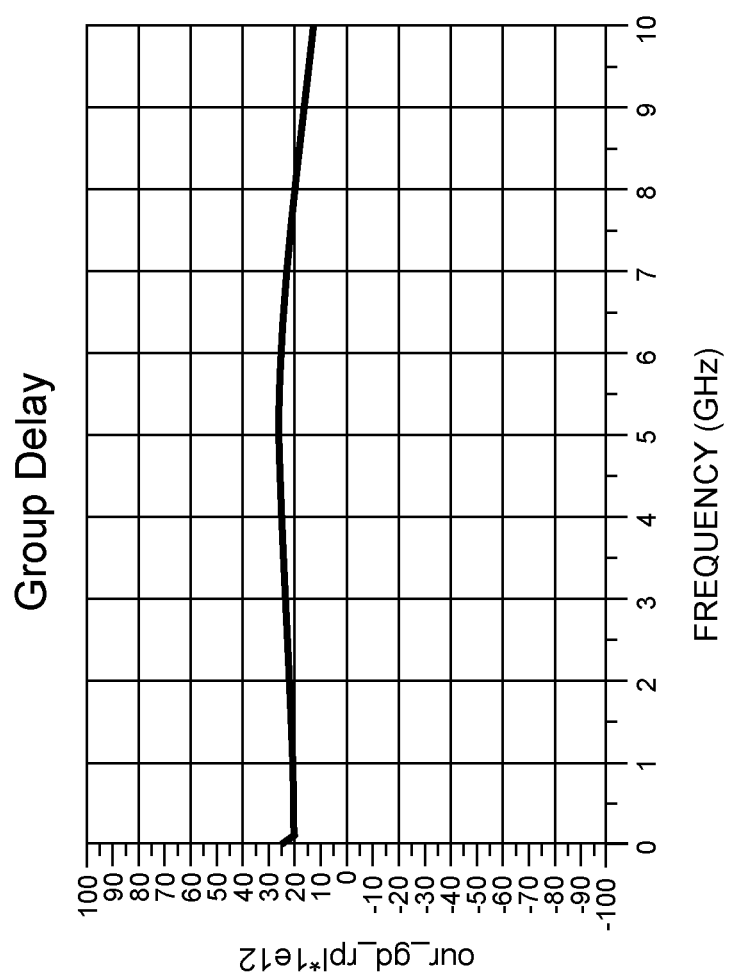
FIG. 20 is a graph of group delay versus frequency for a 10 GHz bandwidth version of the active photonic device illustrated in FIG. 14 and FIG. 15.
Figure 21:
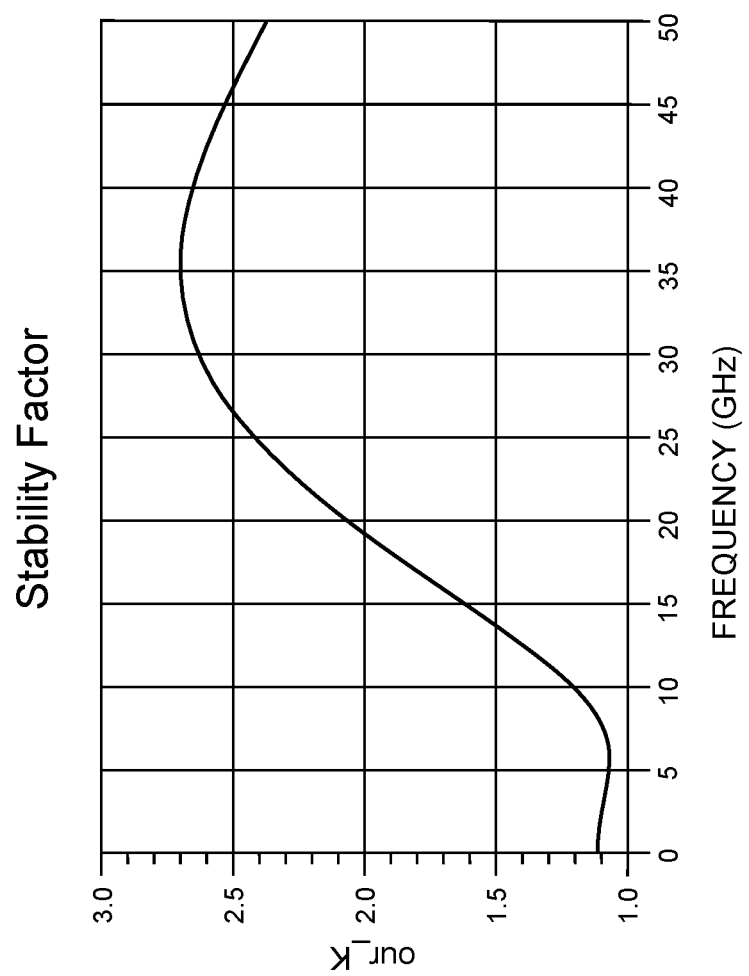
FIG. 21 is a graph of stability factor responses for the embodiment corresponding to the group delay graph of FIG. 20.

FIG. 20 is a graph of group delay versus frequency for a 10 GHz bandwidth version of the active photonic device 72 illustrated in FIG. 14 and FIG. 15. Observe that a group delay of +/−10 pS is achieved across an entire 10 GHz bandwidth. FIG. 21 is a graph of stability factor responses for the same embodiment. Note that the stability factor is greater than 1 over a 50 GHz bandwidth.

Figure 22:
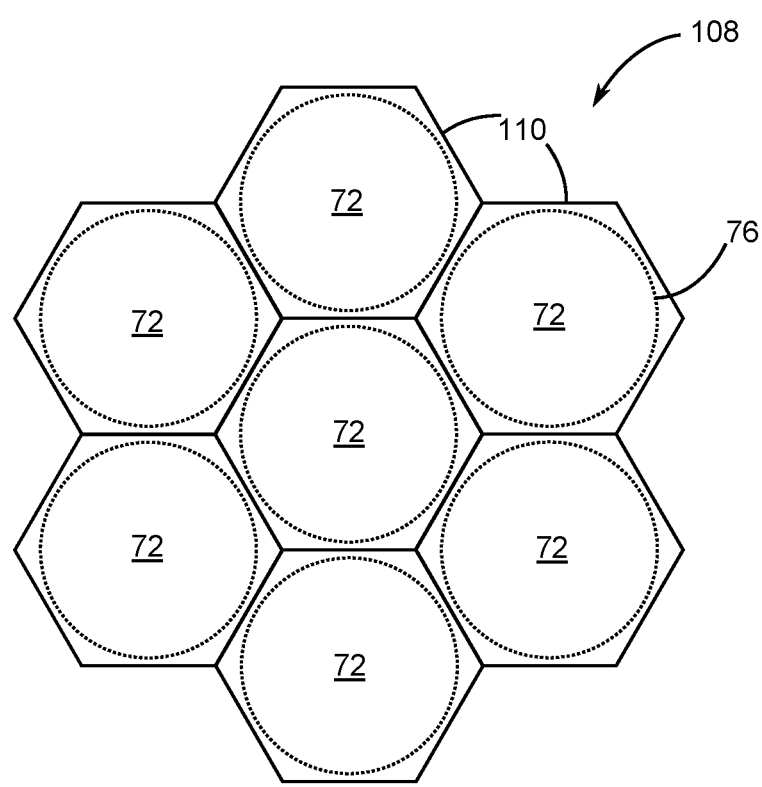
FIG. 22 is a simplified top view diagram of a photodetector array made up of a plurality of the active photonic device illustrated in FIG. 14 and FIG. 15.

FIG. 22 is a simplified top view diagram of a photodetector array 108 made up of a plurality of the active photonic device 72 illustrated in FIG. 14 and FIG. 15. FIG. 22 is a simplified top view diagram of a photodetector array 108 made up of a plurality of the active photonic device 72. An ohmic contact 110 coupled to the collector layer 76 (FIGS. 14 and 15) is polygon shaped in at least one embodiment. In an exemplary embodiment, the ohmic contact 110 is hexagonal shaped. The collector layer 76 is represented by a dashed circle because in this exemplary embodiment a light signal is received from the backside. In this embodiment, the substrate 74 (FIGS. 14 and 15) is optically translucent to a desired wavelength of light to be received by the photodetector array 108. Due to the hexagonal shape, the photodetector array 108 is efficient with regard to footprint and detector area. As such, applications of this disclosure extend into high data-rate serial and/or parallel communications as well as compact voltaic solar cells wherein the disclosed ring-shaped regions have a multi-quantum structure with high spectral absorption/detection of light, which is typical of triple or multi-quantum well structures.

Those skilled in the art will recognize improvements and modifications to the preferred embodiments of the present disclosure. All such improvements and modifications are considered within the scope of the concepts disclosed herein and the claims that follow.

What is claimed is:

1. A method of manufacturing an active photonic device having a Darlington configuration, the method comprising:
   providing a substrate;
   disposing a collector layer over the substrate, the collector layer comprising:
      an inner collector region; and
      an outer collector region that substantially surrounds the inner collector region and is spaced apart from the inner collector region;
   disposing a base layer over the collector layer, the base layer comprising:
      an inner base region;
      a first outer base region; and
      a second outer base region, wherein the first outer base region and the second outer base region are spaced apart from the inner base region and each other while substantially surrounding the inner base region;
   disposing an emitter layer over the base layer, the emitter layer comprising:
      an inner emitter region that is ring-shaped and extends substantially around an outer periphery of the inner base region;
      a first outer emitter region; and
      a second outer emitter region, wherein the first outer emitter region and the second outer emitter region are spaced apart from the inner base region and each other while substantially surrounding the inner emitter region;
   fabricating a first connector structure that electrically couples the inner collector region with the first outer base region;
   fabricating a second connector structure that electrically couples the first outer emitter region to the second outer base region; and
   fabricating a feedback resistor that electrically couples the outer collector region and the inner base region.

2. The method of manufacturing the active photonic device having a Darlington configuration of claim 1 wherein the outer collector region, the first outer base region, and the first outer emitter region form a first transistor, and the outer collector region, the second outer base region, and the second outer emitter region form a second transistor that is coupled to the first transistor in a Darlington configuration.

3. The method of manufacturing the active photonic device having a Darlington configuration of claim 2 wherein the inner collector region, the inner base region, and the inner emitter region form a third transistor having the inner collector region coupled to the first outer base region of the first transistor for driving the first transistor and the second transistor when light impinges upon the third transistor.

4. The method of manufacturing the active photonic device having a Darlington configuration of claim 1 further including disposing a sub-collector layer between the collector layer and substrate, wherein the sub-collector layer has an inner sub-collector region, a first outer sub-collector region, and a second outer sub-collector region, wherein the first outer sub-collector region and the second outer sub-collector region are spaced apart from the inner sub-collector region while substantially surrounding the inner sub-collector region.

5. The method of manufacturing the active photonic device having a Darlington configuration of claim 4 wherein the inner base region is a P-layer that is p-doped, the inner collector region is an i-layer that is intrinsic, and the sub-collector layer is an N-layer that is n-doped to form a P-i-N structure.

6. The method of manufacturing the active photonic device having a Darlington configuration of claim 1 wherein the inner collector region is isolated from the outer collector region.

7. The method of manufacturing the active photonic device having a Darlington configuration of claim 1 wherein the substrate is transparent to at least one wavelength of light.

8. The method of manufacturing the active photonic device having a Darlington configuration of claim 7 wherein a light signal is back-side coupled through the substrate.

9. The method of manufacturing the active photonic device having a Darlington configuration of claim 8 configured for flip-chip packaging.

10. The method of manufacturing the active photonic device having a Darlington configuration of claim 7 wherein a light signal is edge coupled through the substrate.

11. The method of manufacturing the active photonic device having a Darlington configuration of claim 1 further including coupling a polygon-shaped ohmic contact to the collector layer.

12. The method of manufacturing the active photonic device having a Darlington configuration of claim 11 wherein the polygon-shaped ohmic contact is configured to mechanically and electrically couple to a plurality of similarly configured active photonic devices.

13. The method of manufacturing the active photonic device having a Darlington configuration of claim 1 wherein the active photonic device is configured to operate at a supply voltage that ranges from 1 V to about 5 V.

14. The method of manufacturing the active photonic device having a Darlington configuration of claim 1 wherein the active photonic device is configured to operate at a supply voltage that ranges from 5 V to about 10 V.

15. The method of manufacturing the active photonic device having a Darlington configuration of claim 1 wherein the collector layer and the base layer are made of gallium arsenide (GaAs).

16. The method of manufacturing the active photonic device having a Darlington configuration of claim 1 wherein the collector layer and the base layer are made of indium gallium arsenide (InGaAs).

17. The method of manufacturing the active photonic device having a Darlington configuration of claim 1 wherein the collector layer and the base layer are made of silicon-germanium.

18. The method of manufacturing the active photonic device having a Darlington configuration of claim 1 wherein the base layer is made of silicon-germanium.

19. The method of manufacturing the active photonic device having a Darlington configuration of claim 1 wherein the base layer is made of germanium.

20. The method of manufacturing the active photonic device having a Darlington configuration of claim 1 wherein the emitter layer is made of indium gallium phosphide (InGaP).

21. The method of manufacturing the active photonic device having a Darlington configuration of claim 1 wherein the emitter layer is made of indium aluminum arsenide (InAlAs).

22. The method of manufacturing the active photonic device having a Darlington configuration of claim 1 configured to receive a modulated light signal with a bit rate of at least 100 Gbps and output an electrical signal of at least 100 Gbps.

23. The method of manufacturing the active photonic device having a Darlington configuration of claim 1 further comprising:
coupling a load resistor between the inner collector region and the outer collector region;
coupling a first emitter resistor between the inner emitter region and a fixed voltage node;
coupling a base resistor between the inner base region and the first outer emitter region;
coupling a second emitter resistor between the first outer emitter region and the fixed voltage node; and
coupling a third emitter resistor between the second outer emitter region and the fixed voltage node.

24. The method of manufacturing the active photonic device having a Darlington configuration of claim 1 further comprising coupling a load resistor between the inner collector region and the outer collector region.

25. The method of manufacturing the active photonic device having a Darlington configuration of claim 1 further comprising:
coupling a load resistor between the inner collector region and the outer collector region; and
coupling a base resistor between the inner base region and the first outer emitter region.

* * * * *

UNITED STATES PATENT AND TRADEMARK OFFICE
CERTIFICATE OF CORRECTION

Page 1 of 1

PATENT NO. : 10,854,769 B2
APPLICATION NO. : 16/167788
DATED : December 1, 2020
INVENTOR(S) : Kevin Wesley Kobayashi It is certified that error appears in the above-identified patent and that said Letters Patent is hereby corrected as shown below:

In the Specification

Column 8, Line 53, replace "inner base contact B" with --inner base contact $B_i$--.

Signed and Sealed this
Twenty-sixth Day of January, 2021

Drew Hirshfeld
*Performing the Functions and Duties of the
Under Secretary of Commerce for Intellectual Property and
Director of the United States Patent and Trademark Office*